United States Patent [19]
Thony et al.

[11] Patent Number: 5,982,802
[45] Date of Patent: Nov. 9, 1999

[54] SOLID MICROLASER WITH OPTICAL PUMPING BY VERTICAL CAVITY SEMICONDUCTOR LASER

[75] Inventors: Philippe Thony, La Buisse; Engin Molva, Grenoble; Jean-Jacques Aubert, Sassenage; Guy LaBrunie, Saint-Ismier, all of France

[73] Assignee: Commissariat a l'Energie Atomique, Paris, France

[21] Appl. No.: 08/891,706

[22] Filed: Jul. 9, 1997

[30] Foreign Application Priority Data

Jul. 26, 1996 [FR] France ................................. 96 09437

[51] Int. Cl.⁶ ............................. H01S 3/19; H01S 3/091
[52] U.S. Cl. ................................ 372/75; 372/50
[58] Field of Search ................... 372/96, 50, 29, 372/25, 75

[56] References Cited

U.S. PATENT DOCUMENTS

| | | | |
|---|---|---|---|
| 5,455,836 | 10/1995 | Li et al. | 372/25 |
| 5,488,619 | 1/1996 | Injeyan et al. | 372/12 |
| 5,495,494 | 2/1996 | Molva et al. | 372/98 |
| 5,513,204 | 4/1996 | Jayaraman | 372/96 |
| 5,784,396 | 7/1998 | Guerin | 372/29 |
| 5,796,771 | 8/1998 | DenBaars et al. | 372/75 |

FOREIGN PATENT DOCUMENTS

| | | |
|---|---|---|
| 0 523 861 | 1/1993 | European Pat. Off. . |
| 0653 824 | 5/1995 | European Pat. Off. . |
| 0 724 316 | 7/1996 | European Pat. Off. . |

OTHER PUBLICATIONS

Phillippe Thony, et al., Advanced Solid–State Lasers, Jan. 31, 1996 to Feb. 3, 1996, "1.55 UM–Wavelength CW Microchip Lasers".

K. Iga, et al., Surface Emitting Semiconductor Lasers and Arrays, pp. 87–103, 1993, "Vertical Cavity Surface Emitting Lasers and Arrays". No Month Provided.

*Primary Examiner*—Rodney Bovernick
*Assistant Examiner*—Quyen Phan Leung
*Attorney, Agent, or Firm*—Oblon, Spivak, McClelland, Maier & Neustadt, P.C.

[57] ABSTRACT

A microlaser having input and output mirrors defining a microlaser cavity, a solid active dielectric medium disposed in the microlaser cavity, and a pumping mechanism which pumps the microlaser and which includes at least one vertical cavity semiconductor laser. The microlaser may also include a microoptical focusing device, passive and/or active cavity switches. A plurality of such microlasers can be assembled to form a bidimensional network.

15 Claims, 4 Drawing Sheets

SOLID MICROLASER WITH OPTICAL PUMPING BY VERTICAL CAVITY SEMICONDUCTOR LASER

DESCRIPTION

TECHNICAL FIELD AND PRIOR ART

The invention relates to the field of microlasers or microlaser cavities, which have a solid active medium.

Microlasers have numerous applications in fields as varied as the car industry, the environment, scientific instrumentation and telemetry.

The structure of a microlaser is that of a stack of multilayers. The active laser medium is constituted by a material of limited thickness (between 150 and 1000 $\mu$m) and small size (a few mm$^2$), on which are directly deposited dielectric cavity mirrors. This active medium can be pumped by a III-V laser diode, which is either directly hybridized on the microlaser, or coupled to the latter by an optical fibre. The possibility of collective production using microelectronics means allows a mass production of such microlasers at very low cost.

The attached FIGS. 1 and 2 show conventional microlaser structures. The structure of FIG. 1 corresponds to a plane-plane microlaser cavity, whilst that of FIG. 2 corresponds to a planoconcave microlaser cavity. It is also possible to have biconcave microlaser cavities. In all these cases, the basic structure consists of an active laser medium 2, the microlaser cavity being bounded by an input mirror 4 and an output mirror 6. These cavities can also incorporate other intracavity elements, such as e.g. a saturable absorber deposited in thin film form, as described in EP-653 824 (U.S. Pat. No. 5,495,494).

A certain number of longitudinal or transverse modes can oscillate within such a laser cavity, no matter what the structure thereof. These modes resonate at different frequencies and the presence of several modes in the cavity results in a spectral spread of the beam emitted by the microlaser.

It is possible to calculate the thickness of the active laser medium 2 or the microlaser cavity, so as to only obtain a single longitudinal mode. Such a calculation and examples are given in EP-653 824.

Generally, the laser beam obtained has several transverse modes. This leads to a divergence of the laser beam emitted by the microlaser. In order to obtain a high quality and less divergent beam, the problem consequently arises of eliminating or reducing the level or intensity of the transverse modes. In addition, the pumping efficiency of a microlaser cavity is low, particularly in the case of a stable cavity (e.g. planoconcave).

Finally, in general terms, there is also the problem of lowering the microlaser operating threshold, i.e. the incident power necessary for operating the microlaser.

DESCRIPTION OF THE INVENTION

The invention relates to a microlaser having, compared with known microlasers, a better quality beam (in particular a reduced divergence), a better pumping efficiency (particularly in the case of a stable cavity) and a lower operating threshold.

The invention relates to a microlaser having a solid active medium, an input mirror and an output mirror defining a microlaser cavity, as well as means for pumping the cavity incorporating at least one vertical cavity semiconductor laser.

The pumping of the microlaser is no longer ensured by a conventional laser diode, e.g. of the III-V type, but instead by a vertical cavity semiconductor laser.

Vertical cavity semiconductor lasers (VCSEL) are lasers using a multiple quantum well semiconductor material as the active medium. The thickness of the active laser medium is very small, because it only contains a few quantum wells. This active medium is surrounded by two mirrors, also constituted by successive, thin semiconductor films. The axis of the laser cavity is perpendicular to the layer structure, hence the term "vertical cavity" lasers. The laser beam comes from the surface of the laser chip.

The use of such VCSELs suffers from certain disadvantages. Firstly, the power density emitted by a VCSEL is low, being typically about 50 mW for a diameter 30 $\mu$m beam, whereas a "conventional" laser diode emits, for the same surface, a power of approximately 1 W. Moreover and like laser diodes, VCSELs are sensitive to feedback. This is the return of light emitted by the VCSEL to itself, which disturbs its stability (in particular there are instabilities in time of the spectral width of the beam emitted by the VCSEL). Despite these disadvantages, a laser beam emitted by a VCSEL pumped microlaser has good properties.

A VCSEL pumped microlaser has a better quality beam than a microlaser pumped by a conventional diode, the beam divergence being reduced.

Moreover, the operating threshold of the microlaser is lowered. The spectral width in emission of a VCSEL is lower than that of a conventional diode and comparable to the spectral width of the absorption band of the microlaser ($\Delta\lambda_{abs} \approx 1$ nm for a YAG microlaser, $\Delta\lambda_{emission} \approx 0.3$ nm for a VCSEL and $\approx 3$ nm for a 1 W power pumping diode).

Finally, the geometry of the beam emitted by a VCSEL is circular and symmetrical and not rectangular and not suffering from anamorphosis, as in the case of laser diodes. This permits an easier coverage of the beam emitted by the VCSEL and the circular structure, fundamental mode of the microlaser. More particularly in the case of a stabilized microlaser cavity, the shape of the beam emitted by a VCSEL is very well adapted to the pumping of the fundamental mode. The VCSEL emits a lower power density than a conventional laser diode, but said density is better distributed for the pumping of the fundamental mode of the microlaser. Hence there is a better pumping efficiency and a better pumping of the fundamental mode. In addition, the combination of a microlaser and a VCSEL offers the following advantages.

The microlaser is produced through a stack of successive layers having a different nature and function (mirror, active medium, saturable absorber, etc.). Use is made of substrates of considerable dimensions (diameter 1 to 2 inches, i.e. 25.4 to 50.8 mm) and from a substrate it is possible to produce several hundred microlasers. Finally a cutting and assembly stage makes it possible to isolate the chips and assemble them with the laser diodes.

The production of conventional, e.g. III-V laser diodes also takes place collectively. It is also terminated by an individual, chip fitting or assembly phase. On producing a laser diode pumped microlaser, the fitting or assembly stage is duplicated, because there are two individual assembly stages.

The production of VCSELs involves the formation of layers on a substrate and etching stages compatible with collective production. Thus, VCSEL plates are produced, which can easily be assembled with the microlaser plates and the assembly of said plates is then cut. Thus, production is simpler from the technological standpoint.

This simplicity has repercussions on the overall cost of production. One costly assembly stage is eliminated. This is of more particular interest in view of the fact that the microlasers can be produced with the aid of microelectronics methods, whose aim is to permit collective production so as to obtain numerous components.

Finally, the VCSEL structure is suitable for the production of bidimensional networks or systems (2D). However, in the case of laser diodes, it is possible to produce strips, but it is difficult to produce laser diodes in accordance with a bidimensional network. In the case of VCSELs, the aforementioned production methods firstly lead to VCSEL bidimensional systems.

In summarizing, the structure of the microlasers according to the invention makes it possible to improve the quality of the laser beam emitted by the microlaser, especially by improving the geometrical characteristics of the beam emitted by the microlaser, by increasing the differential efficiency of the microlasers and by reducing the microlaser operating threshold (in incident power).

In addition, the structure of the microlaser according to the invention is compatible with a simple collective production of the assembly constituted by the pumping means and the microlaser cavity.

The microlaser structure according to the invention is compatible with a microlaser cavity operating continuously, or in a switched pulse mode, of an active or passive nature.

It is possible to couple a microlaser with a VCSEL network, which is facilitated, as stated hereinbefore, by the VCSEL production process. Focussing means can be provided between the VCSEL or VCSEL system and the microlaser cavity.

BRIEF DESCRIPTION OF THE DRAWINGS

Other features and advantages of the invention can be better gathered from the following description given in a purely illustrative and non-limitative manner with reference to the attached drawings, wherein show.

DETAILED DESCRIPTION OF EMBODIMENTS OF THE INVENTION

In general terms, a microlaser according to the invention has an active solid medium, within a microlaser cavity defined by an input mirror and an output mirror. The active laser material essentially consists of a base material doped with active laser ions.

The base material can be a crystalline material, e.g. chosen from one of the following materials: YAG ($Y_3Al_5O_{12}$), LMA ($LaMgAl_{11}O_{19}$), $YVO_4$, YSO ($Y_2SiO_5$), YLF ($YLiF_4$) or $GdVO_4$, etc. Choice criteria for one or other of these materials are given in EP-653 824 (U.S. Pat. No. 5,495,494). This document also gives information on the choice of the thickness e of the active laser medium, particularly for obtaining a monomode laser, typically, the thickness of the active medium is approximately:

750 $\mu$m for a YAG active medium,
500 $\mu$m for a $YVO_4$ active medium,
150 $\mu$m for a LMA active medium.

With regards to the doping ions, a choice is generally made of neodymium (Nd) for a laser emission around 1.06 $\mu$m. It is also possible to choose erbium (er) or an erbium-ytterbium codoping (Er+Yb) for an emission around 1.5 $\mu$m. For an emission around 2 $\mu$m, a choice is made of thulium (Tm), or holmium (Ho), or a thulium-holmium codoping. Doping with ytterbium only makes it possible to obtain an emission at 1.03 $\mu$m.

It is also possible to produce an active medium constituted by a glass, e.g. doped with erbium and ytterbium (emission at 1.55 $\mu$m), as explained in the article by P. Thony et al. entitled "1.55 $\mu$m wavelength CW microchip laser", Proceedings of Advanced Solid-State Laser 1996, San Francisco. The active laser medium is consequently dielectric.

Figure 3A:
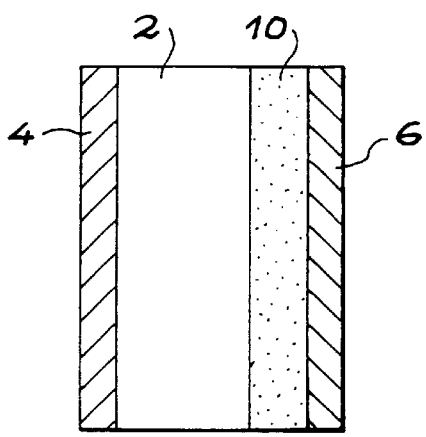
FIGS. 3A and 3B A microlaser cavity with intracavity saturable absorber without (FIG. 3A) and with (FIG. 3B) a microlens for stabilizing the cavity.
Figure 3B:
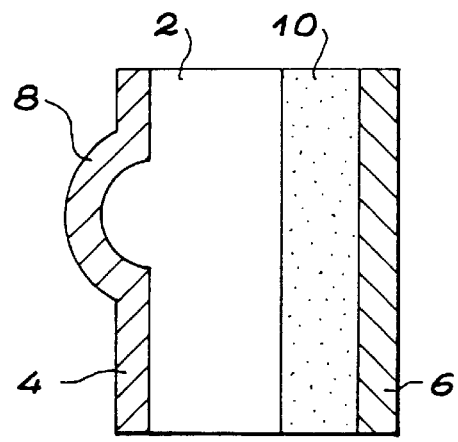

Another element can also be present within the microlaser cavity according to the invention, i.e. a saturable absorber element 10 (FIGS. 3A and 3B). In a particularly advantageous manner, the saturable absorber can be a thin saturable absorber material film directly deposited on the solid active medium 2. If the latter has a crystalline structure, an interesting process for the production of said saturable absorber film is liquid phase epitaxy. In this case, the film 16 is constituted by a base material, identical to that of the solid active medium 2, and doped with ions giving it saturable absorber properties, e.g. chromium ($Cr^{4+}$) or erbium ($Er^{3+}$) ions. It is therefore possible to obtain a saturable absorber film directly deposited on the active laser medium and with a thickness between a few $\mu$m and approximately 400 $\mu$m. All the information necessary for producing such a saturable absorber film is given in EP-653 824 (U.S. Pat. No. 5,495,494). It is in particular possible to make a saturable absorber deposition on either side of the active laser medium 2 and obtain a microlaser cavity with two saturable absorber material films directly deposited on the active laser medium. It is also possible to produce microlenses 8 of a transparent material (e.g. silica) on the surface of the active laser material 2. Once again, all the necessary informations for producing such microlenses is given in EP-653 824. The microlenses make it possible to stabilize the microlaser cavity.

Figure 4:
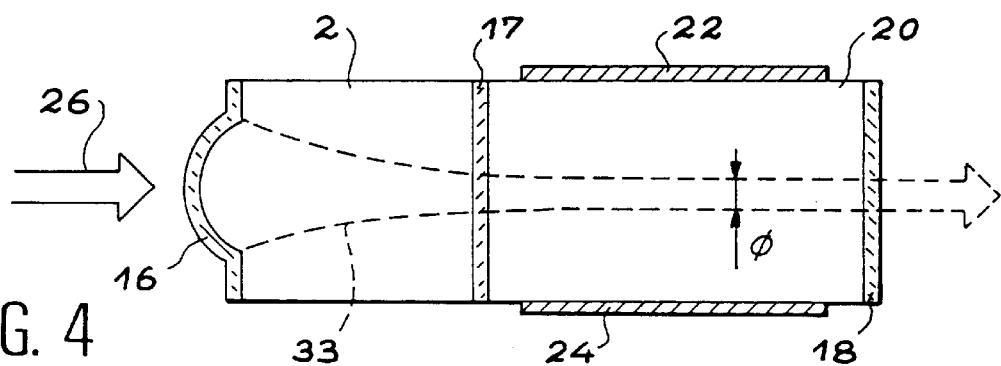
FIG. 4 An active switching microlaser example.

The active laser material of a microlaser cavity according to the invention can also be associated with active switching means located within the cavity. This embodiment is illustrated in FIG. 4, where reference 2 once again designates the active laser medium and where the cavity is bounded by input mirror 16 and output mirror 18 of the active laser medium. Thus, an intermediate mirror 27 defines two cavities, namely a first resonant cavity is constituted by the active laser medium and a second resonant cavity by a material 20 having an index able to vary as a function of external disturbances. This material 20 can be an electrooptical material, such as $LiTaO_3$, to which is applied a potential difference with the aid of two contact electrodes 22, 24. A pumping beam 26 is directed onto the input mirror 16. The concave mirror 16 ensures a reduction in the size of the laser beam in the electrooptical medium 20. The conditions relative to the radius of curvature of said mirror and the process for producing the structure of FIG. 4 are given in FR-95 00767 (U.S. Pat. No. 08/587,477).

Other optical elements can also be provided within the microlaser cavity, e.g. a non-linear, frequency doubler or tripler crystal, or an optical parametric oscillator.

No matter whether the microlaser cavity incorporates a saturable absorber, or an active cavity switching means, or an optically non-linear element (frequency doubler, tripler, OPO), the beam from the microlaser cavity according to the invention still benefits from advantageous properties associated with the pumping by a vertical cavity semiconductor laser.

Figure 5:
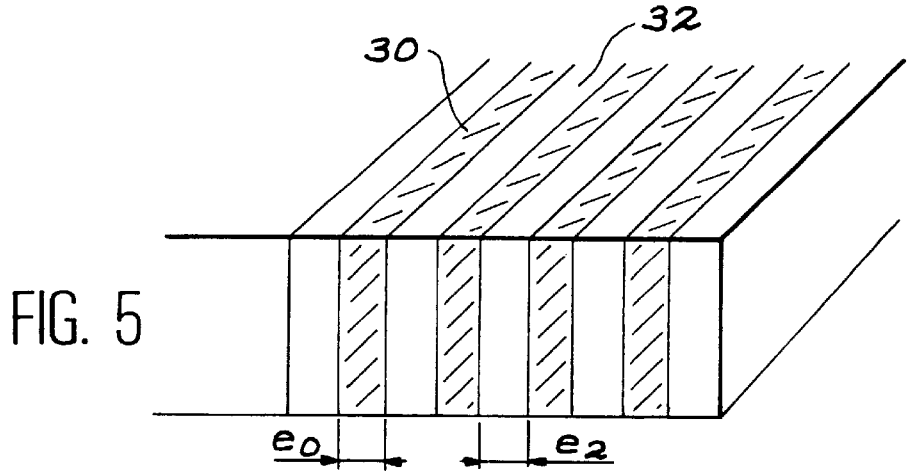
FIG. 5 A multiple quantum well structure.

Vertical cavity semiconductor lasers use a multiple quantum well structure as the active medium. As illustrated in FIG. 5, such a structure is a periodic arrangement of layers or films 30 of material having a very wide forbidden band (e.g. GaAlAs) and layers or films 32 of a semiconductor material with a small forbidden band width (e.g. GaAs). Such structures can be obtained by vapour phase epitaxy from organometallic compounds, e.g. MOCVD (organometallic chemical vapour phase deposition), or by molecular beam epitaxy. Using such methods, it is possible to adjust the deposit and thickness of semiconductor material films with an accuracy of the same order of magnitude as the interatomic distance. Thus, the thickness $e_0$ of film 30 and the thickness $e_2$ of film 32 can be very precisely adjusted.

Figure 6:
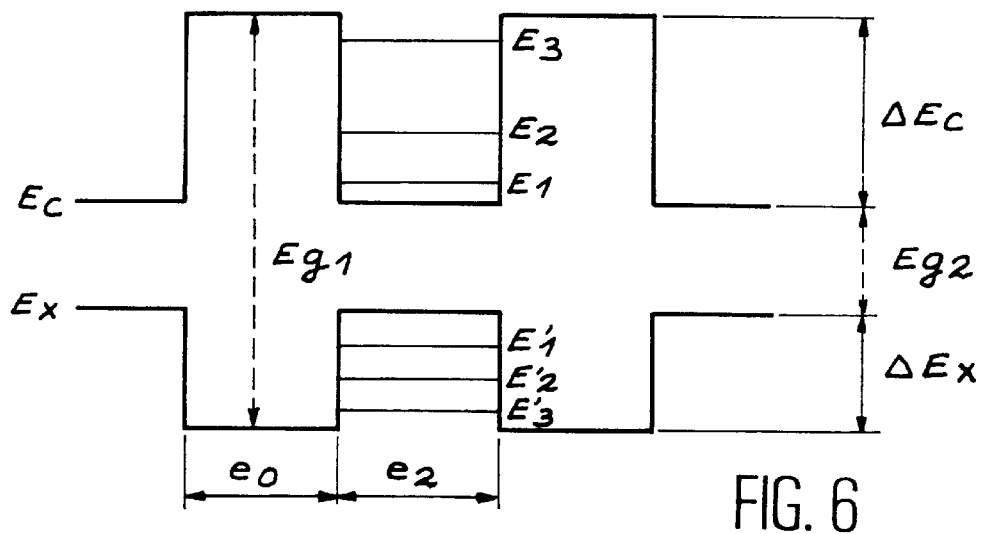
FIG. 6 Energy levels of a multiple quantum well structure.

From the energy standpoint, such a structure can be diagrammatically characterized in the manner shown in FIG. 6. More specifically, FIG. 6 shows the profile of the potential wells and the discreet energy levels assumed by the carriers respectively in the conduction and valency bands (respectively electrons and holes). When an epitaxy, semiconductor film with a small forbidden band (film with a typical thickness of about 10 nm) is surrounded by two films with a larger forbidden band (such as films 30 in FIG. 5), the electrons and holes of low forbidden band material are confined in monodirectional potential wells.

The movement of an electron into a well created in the conduction band of height $\Delta E_c$ is quantified in discreet states of energy $E_1$, $E_2$, $E_3$, etc. In the same way, the movement of a hole into a well created in the valency band $\Delta E_v$ is quantified in discreet states of energy $E'_1$, $E'_2$, $E'_3$.

When the thickness of the small forbidden band material varies, the energy states assumed by the carriers also vary. The emission length of the multiple quantum well structures can consequently be adjusted by the choice of the nature and thickness of the semiconductor material films.

In a vertical cavity semiconductor laser, such a structure constitutes the active medium. This active medium is inserted between two Bragg mirrors. Each monolithic mirror can be produced at wavelength $\lambda$ by using a stack of films i and j of material having high and low optical indices $n_{ij}$ of thickness $(\lambda/4)n_{ij}$. Such films can be produced by semiconductor compound epitaxy, whereof the composition and thickness are controlled. The reflectivity of these mirrors can be adjusted as a function of the VCSEL emission wavelength. The cavity can be electrically pumped with the aid of electrodes connected on either side of the structure.

Vertical cavity semiconductor laser structures are described in the article by k. IGA et al. "Surface emitting semiconductor laser and arrays", pp 87–117 (1993, Academic Press, San Diego).

Figure 7:
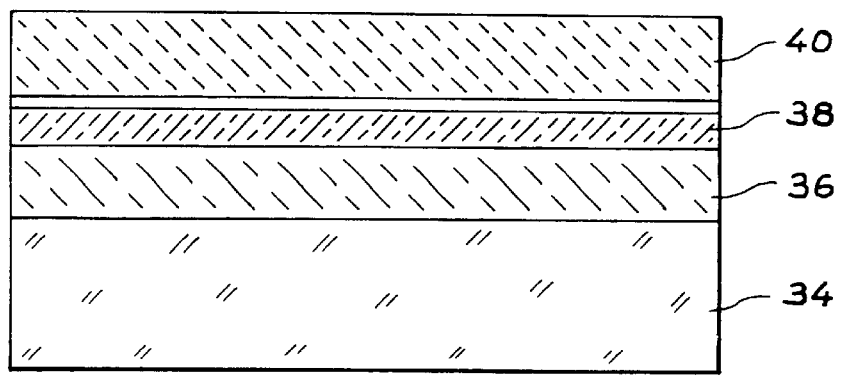
FIG. 7 Diagrammatically a VCSEL.

An example of such a structure is illustrated in FIG. 7. This structure has a p-doped InP substrate 34 on which is formed a p-doped InAlAs film 36 of thickness 0.4 μm. On said film is produced the multiple quantum well structure 38 involving 10 alternations of 9 nm thick InGaAs and 20 nm thick InAlAs films. Finally, the assembly is covered with a 0.3 μm thick, n-doped InAlAs film 40.

In general terms, the spacing between the mirrors of a VCSEL is approximately 1 to 2 μm. Therefore the modes of such a laser are well separated (very great spectral range).

Typically, the beam emitted by a VCSEL is circular with a diameter of approximately 20 μm, has a divergence of approximately 7° and a spectral width of a few tenths of a nanometer (e.g. 0.3 nm).

An AlGaAs-based VCSEL can emit a few milliwatts at a wavelength between 800 and 850 nm in a circular section beam of approximate diameter 8 μm.

A VCSEL with an InGaAs-based material emits a power of approximately 50 mW at approximately 980 nm, for a circular beam with a diameter of approximately 30 μm. The above powers correspond to the continuous emission powers. The VCSEL diameter varies from a few um to 150 μm.

Figure 8:
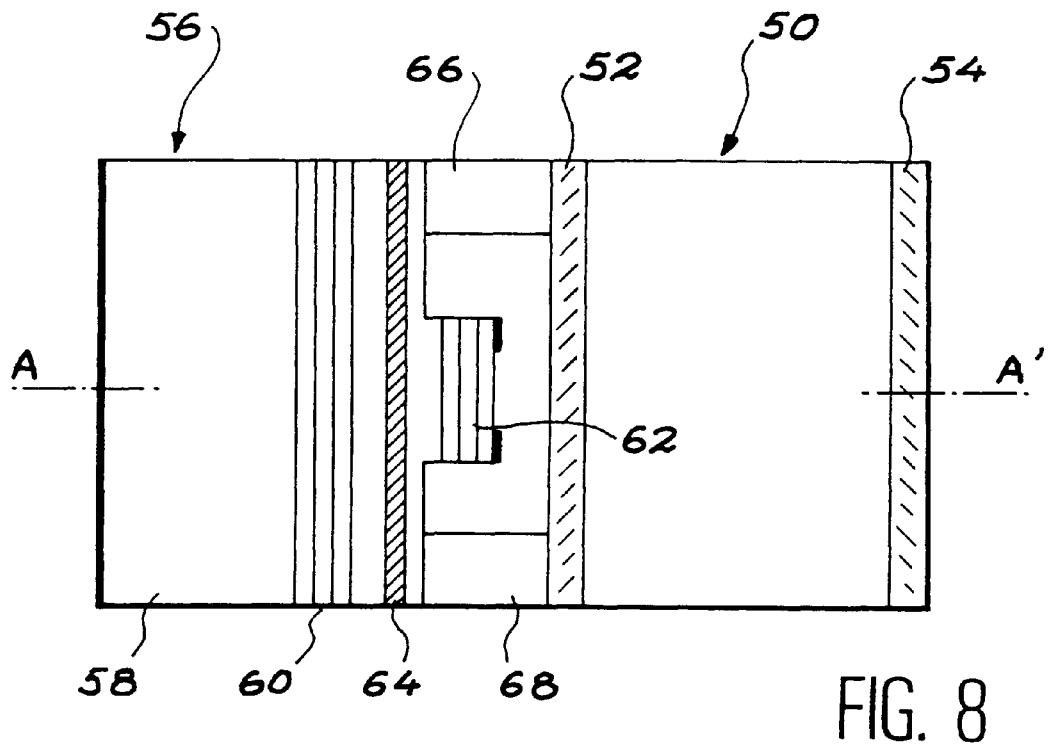
FIGS. 8 to 11 Microlasers according to the invention.

FIG. 8 shows an embodiment of a microlaser according to the invention. The microlaser cavity 50 is of the type described hereinbefore with an active laser medium and optionally other intracavity elements. The cavity is bounded by an input mirror 52 and an output mirror 54. The microlaser is pumped by a vertical cavity semiconductor laser 56 having a substrate 58, a input mirror 60 and an output mirror 62. The active area (with a multiple quantum well structure) is designated by the reference 64. The VCSEL 56 emits a beam in a direction perpendicular to the active area 64 and therefore located in the microlaser cavity axis AA'. The two elements are advantageously mechanically coupled, e.g. with spacers 66, 68.

Figure 9:
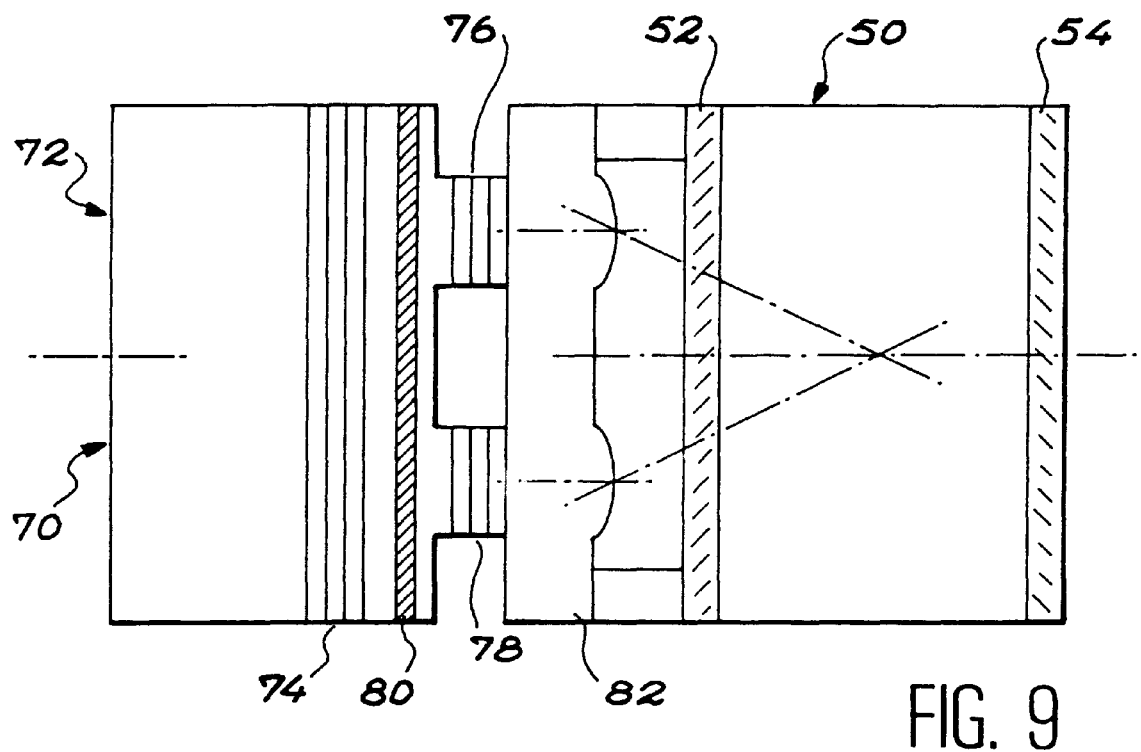

FIG. 9 shows two vertical cavity semiconductor lasers 70, 72 having a common structure forming an input mirror 74 and each having an output mirror 76, 78. The active area 80 is also formed by an assembly of films common to both VCSELs. Each of the VCSELs emits a beam in a direction perpendicular to the active area 80 and can pump part of the active medium of the microlaser 50. In addition, microoptical means 82 can also be provided making it possible to focus the pumping beams at a point M within the microlaser cavity 50. These means 82 can be constituted by a microlens system corresponding to the VCSEL system used for pumping the microlaser 50. Such microlenses and their production process are described in EP-523 861 (MITSUI).

Figure 10:
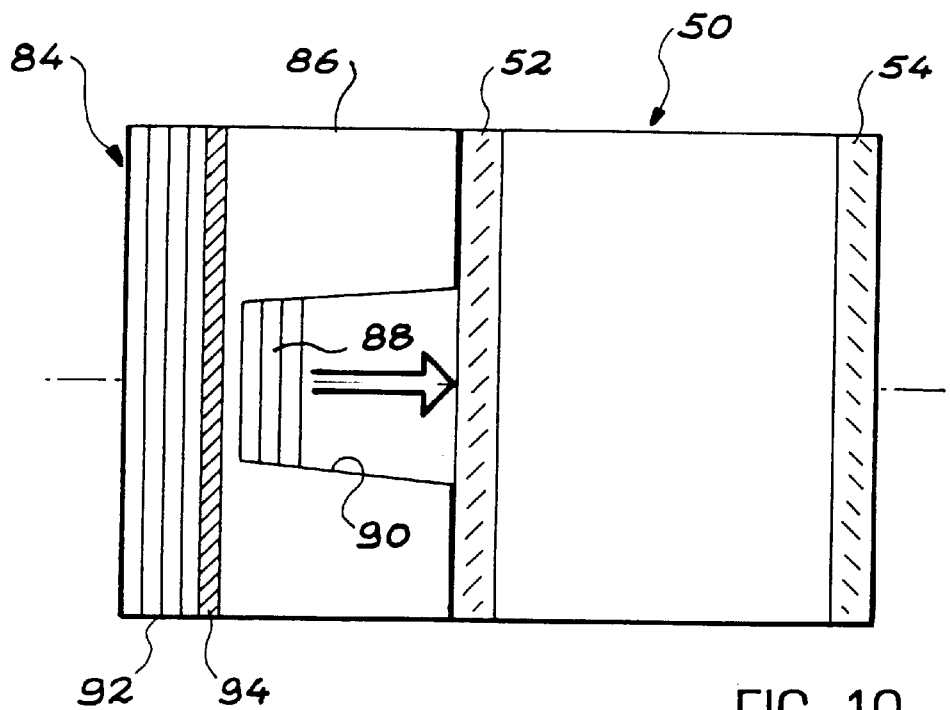

FIG. 10 shows another microlaser structure according to the invention. The same references as in the preceding drawings designate the same elements. A VCSEL 84 pumps the microlaser. This VCSEL has a substrate 86, which is etched. The output mirror 88 is deposited on the bottom of the area 90 obtained by etching. The input mirror and the active area of the VCSEL 84 are respectively designated 92, 94.

Figure 11:
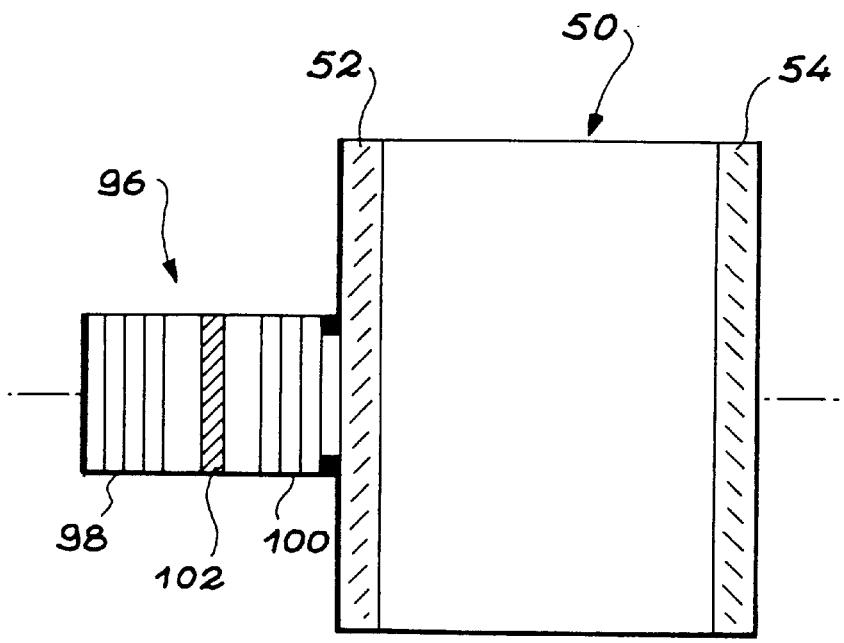

FIG. 11 shows a microlaser 50 pumped by a VCSEL 96 separated from its growth substrate following complete etching. This VCSEL is then joined to the edge of the solid microlaser, followed by cutting in order to give the chip of FIG. 11.

The coupling of a VCSEL with a microlaser makes it possible to increase the differential efficiency of the microlaser and permits a reduction of the incident power laser threshold. Thus, the circular symmetry of the beam emitted by the VCSEL enables it to adapt to the fundamental mode of the microlaser, which also has a circular structure. The diameter of the VCSEL beam is smaller than that of the fundamental mode of the microlaser (which generally has a diameter of approximately 100 μm in a plane-plane cavity). Consequently all the energy of the pumping beam supplied by the VCSEL will be contained within the microlaser beam. In addition, the small divergence of the VCSEL beam enables it to remain in the fundamental mode of the microlaser over the entire length thereof.

Figure 1:
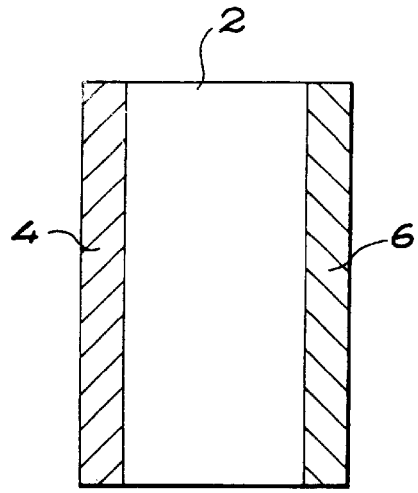
FIGS. 1 and 2, already described, prior art microlaser cavities.
Figure 2:
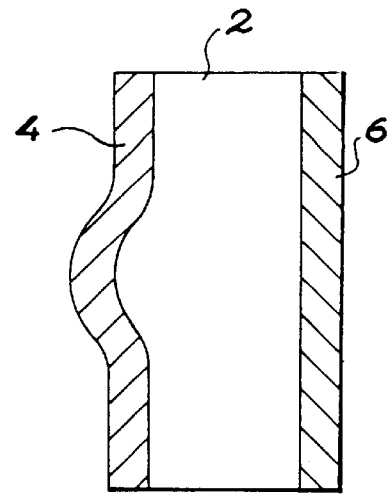

This leads to a very good spatial coverage of the fundamental mode of the microlaser and its pumping beam. Thus, there is an increase in the pumping efficiency compared with the case where the microlaser cavity is pumped with a conventional laser diode. Thus, in the latter case, the laser diode beams are wider than the fundamental mode of the cavity. Consequently, the pumping beam is then absorbed in areas favouring transverse modes other than the fundametal mode of the microlaser cavity. This phenomenon is even more sensitive in planoconcave cavities (FIG. 2) than in plane-plane cavities (FIG. 1). Thus, the fundamental mode of the microlaser is of smaller size (approximate diameter 30 $\mu$m) in the case of a stable, planoconcave cavity than in a plane-plane cavity. In the same way, the loss level of the higher modes introduced by the cavity geometry is smaller in the case of a planoconcave cavity than in the case of a plane-plane cavity. Therefore, in a plano-concave cavity, conventional laser diode pumping favours the appearance of transverse modes ether than the fundamental mode in the microlaser cavities. The pumping by VCSEL of a stabilized microlaser cavity is extremely advantageous, because in this way the diameter of the circular VCSEL beam can always be adapted to the pumping of the fundamental mode of the stabilized cavity. Thus, a stabilized cavity, whose fundamental mode is approximately 30 $\mu$m can be pumped by a VCSEL, whose beam has a diameter of 20 to 30 $\mu$m.

The fact that the spectral width of the beam emitted by a VCSEL is relatively small (a few tenths of a nanometer) also makes it possible to increase the pumping efficiency. A material such as YAG:Nd (in the same way as coherent crystals doped with rare earths) has a relatively thin or fine absorption line for the wavelength of the pumping beam (width at 808 nm:1 nm). A small width pumping spectrum can therefore be entirely contained within the absorption line of the crystal (in particular YAG:Nd at 808 nm). Therefore a greater absorption is obtained, together with a better pumping efficiency.

Finally, the pumping of a microlaser by VCSEL makes it possible to improve the quality of the beam emitted by the microlaser. Thus, with a microlaser in the resonant cavity and stabilized by gain effects (the laser beam being locally created where there is sufficient gain), the shape of the laser beam is partly determined by the shape of the pumping beam. In this case, a good pumping beam quality induces a good laser beam quality. In general, the laser beam is adapted to the pumping beam by filling the space in the cavity where the gain is adequate to permit an oscillation. This space is filled by laser modes. If the volume where the gain is adequate, i.e. the volume where the laser threshold is exceeded, exceeds the volume occupied by the fundamental mode, higher order transverse modes appear. If the volume where the gain is adequate is equal or smaller than the volume of the fundamental mode, then there is only the fundamental mode which is excited and oscillates. With a VCSEL, the fundamental mode of the microlaser cavity is selected and consequently the spatial cavity of the laser beam is increased.

The methods for the production of microlaser cavities with a saturable absorber or active cavity switching means have been described in EP-653 824 and FR-95 00767 (U.S. Pat. No. 08,587,477).

These methods involve the production of active medium plates provided with active or passive switching means, as well as input and output mirror films of the microlaser cavities. The individual cavities are obtained by cutting such a plate. Prior to cutting, the active laser medium plate, provided with its switching means and mirror films, is combined with a VCSEL plate.

The VCSELs are produced by semiconductor material epitaxy on a substrate, etching of the emitters, electrical contacting and testing the emitters. For etching the VCSELs, it is of interest to use a mask compatible with that used for etching the solid microlasers.

Processes for the production of GAInAsP VSCELs are given in the article by K. IGA et al. "Surface emitting semiconductor laser and arrays", pp 87–117, 1993.

Other possible materials are:
GaAlAs-GaAs
InGaAs-GdAs
InGaAsP-InP
InAlGaP-GaAs.

Once the VCSEL plate has been produced, the following stage consists of assembling the two plates, namely the VCSEL plate and the microlaser plate. It is e.g. possible to carry out an optical bonding of the two plates with or without a spacer.

The assembly obtained following the combination or joining of the plates or wafers, can be cut with a diamond blade saw or kept in the same state in order to form a bidimensional network. This gives a large number of laser chips with their integrated optical pumping source.

Contacts are then made for supplying the VCSELs. Thus, this solid microlaser device is directly usable with a power supply source, whilst maintaining a low cost for mass production.

A VCSEL pumped microlaser according to the invention can be used in frequency modulation telemetry and eye safety. Other applications are fields as varied as the car industry and scientific instrumentation.

We claim:

1. Microlaser comprising:
    an input mirror and an output mirror defining a microlaser cavity,
    a solid active dielectric medium disposed in said microlaser cavity, and
    a pumping mechanism configured to pump the microlaser comprising at least one vertical cavity semiconductor laser.

2. Microlaser according to claim 1, further comprising a microoptical focussing device inserted between the vertical cavity semiconductor laser and the microlaser cavity.

3. Microlaser according to claim 1, wherein the microlaser cavity is stabilized.

4. Microlaser according to claims 1 or 2, wherein the pumping mechanism comprises a vertical cavity semiconductor laser network.

5. Microlaser according to claims 1 or 2, further comprising a passive cavity switch located inside the microlaser cavity.

6. Microlaser according to claims 1 or 2, further comprising an active cavity switch located inside the microlaser cavity.

7. Microlaser according to claims 1 or 2, wherein the vertical cavity semiconductor laser is based on InAlAs grown on an InP substrate, or based on AlGaAs grown on a GaAs substrate, or based on InGaAsP grown on an InP substrate, or based on InGaAs grown on a GaAs substrate, or based on InAlGaP grown on a GaAs substrate.

8. Microlaser according to claims 1 or 2, wherein a substrate of the vertical cavity semiconductor laser is etched in a shape of a lens.

9. Microlaser according to claim 1, wherein said solid active dielectric medium is a base material doped with active laser ions.

10. Microlaser according to claim 9, wherein said base material is a member selected from the group consisting of YAG ($Y_2Al_5O_{12}$), LMA ($LaMgAl_{11}O_{12}$), $YVO_4$, YSO ($Y_2SiO_5$), YLF ($YLiF_4$), and $GdVO_4$.

11. Microlaser according to claim 9, wherein said active laser ions are members selected from the group consisting of neodymium (Nd), erbium (er), erbium-ytterbium (Er+Yb), thulium(Tm), holmium (Ho), and thulium-holmium (Tm+Ho).

12. Microlaser according to claim 1, wherein said solid active dielectric medium is a doped glass.

13. Microlaser according to claim 12, wherein said glass is doped with erbium and ytterbium.

14. Microlaser system comprising a plurality of microlasers forming a bidimensional network, wherein each microlaser comprises:

a solid active dielectric medium, an input and an output mirror, said input and output mirror defining a microlaser cavity, and a pumping mechanism configured to pump the microlaser and comprising at least one vertical cavity semiconductor laser.

15. Microlaser system according to claim 14, wherein each microlaser further comprises a microoptical focusing device inserted between the vertical cavity semiconductor laser and the microlaser cavity.

* * * * *